(12) United States Patent
Dikken et al.

(10) Patent No.: US 7,446,513 B2
(45) Date of Patent: Nov. 4, 2008

(54) DEAD TIME CONTROL IN A SWITCHING CIRCUIT

(75) Inventors: Jan Dikken, Wijchen (NL); Philip Rutter, Stockport (GB); Kuldeep Kanwar, Hull (GB)

(73) Assignee: NXP B.V., Eindhoven (NL)

( * ) Notice: Subject to any disclaimer, the term of this patent is extended or adjusted under 35 U.S.C. 154(b) by 394 days.

(21) Appl. No.: 10/561,735

(22) PCT Filed: Jun. 10, 2004

(86) PCT No.: PCT/IB2004/001996

§ 371 (c)(1),
(2), (4) Date: Dec. 20, 2005

(87) PCT Pub. No.: WO2004/114509

PCT Pub. Date: Dec. 29, 2004

(65) Prior Publication Data

US 2006/0164867 A1    Jul. 27, 2006

(30) Foreign Application Priority Data

Jun. 21, 2003   (GB)   ................... 0314563.8

(51) Int. Cl.
   *G05F 1/40*   (2006.01)

(52) U.S. Cl. ..................................................... 323/271
(58) Field of Classification Search ................. 323/222, 323/223, 225, 226, 268, 270, 271, 273–276, 323/282–285

See application file for complete search history.

(56) References Cited

U.S. PATENT DOCUMENTS

| 5,777,461 | A  | * | 7/1998  | Massie et al. ............... 323/282 |
| 5,930,132 | A  |   | 7/1999  | Sato |
| 6,381,160 | B1 |   | 4/2002  | Durbaum et al. |
| 6,940,262 | B2 | * | 9/2005  | Dequina et al. ............ 323/284 |
| 7,294,992 | B2 | * | 11/2007 | Yoshikawa .................. 323/222 |
| 2003/0231011 | A1 |   | 12/2003 | Umemoto et al. |

FOREIGN PATENT DOCUMENTS

FR   2 680 056   2/1993

* cited by examiner

*Primary Examiner*—Matthew V Nguyen
(74) *Attorney, Agent, or Firm*—Peter Zawilski

(57) ABSTRACT

A dc-to-dc converter has two field effect transistors connected in series between an input terminal and a ground terminal. Adjustment of the dead time when both transistors are off is carried out by providing Kelvin feedback connections directly across the drain and source of one or both of the transistors, so bypassing signal line resistance and inductances.

18 Claims, 10 Drawing Sheets

DEAD TIME CONTROL IN A SWITCHING CIRCUIT

The invention relates to a switching circuit, and a method of operating a switching circuit, particularly but not exclusively to a dc-to-dc voltage converter circuit.

Direct current (dc) to dc converters are well known in the art, and are used to convert from one dc voltage to another, for example to provide a 1.5V voltage rail from a 12V voltage supply.

One type of converter, a synchronous dc-dc converter, operates by alternately switching a first terminal of an inductor coil between an input voltage, for example, 12V, and ground. An output is taken at a second terminal of the inductor coil, buffered by an output capacitor. The switches used in such a device may be driven by a pulse width modulated (PWM) signal, the duty cycle (the ratio of the length of time that the signal is high compared to that when it is low) of which determines the magnitude of the output signal.

A known type of synchronous dc-dc converter is illustrated schematically in FIG. 1. The switches which control the current flowing in the inductor coil 1 are, in this example, field effect transistors (FETs). A first FET 2, generally referred to as the control FET, or high-side transistor, connects a first terminal 3 of the inductor 1 to a dc input voltage supplied at a supply terminal 4. A second FET 5, generally referred to as the synchronous FET (sync FET) or low-side transistor, connects the first terminal 3 of the inductor 1 to a ground terminal 6. The first terminal 3 of the inductor 1 is generally referred to as the switch node.

The signal at the switch node 3 feeds through the inductor 1 and across a capacitor 7, to an output terminal 8.

The control FET 2 and sync FET 5 are driven by respective drivers 9, 10. A control circuit 11 has an input terminal 12 fed by a pulse width modulation (PWM) signal and another input fed from the output terminal 8, via a feedback path 13. The control circuit 11 supplies alternating control signals 14, 15 to control the control and sync FETs 2, 5 to maintain a desired voltage at the output 8 by switching the FETs 2, 5 off and on alternately. The duty cycle of the PWM signal input at terminal 12 is modulated to achieve the desired voltage on the output 8.

Examples of such dc-dc converters include those presented in WO98/49607 to Intel Corporation and U.S. Pat. No. 5,479,089 to Lee.

One feature of synchronous dc-dc converters is that the control and sync FETs 2, 5 should not be on simultaneously. Even when the FETs 2, 5 are only momentarily on at the same time, large currents will flow between the supply and ground terminals 4, 6. This phenomenon is known as cross-conduction. Accordingly, the control circuit 11 is arranged to ensure that only one of the two FETs 2, 5 is on at any one time. This is achieved by introducing a dead time during which both of the FETs 2, 5 are off, usually by delaying turn on of each FET until the other is determined to be off.

One way of implementing the control circuit 11 is to monitor two voltages. The voltage at the switch node 3 is monitored to prevent the switching on of the sync FET 5 until the control FET 2 is switched off, while the voltage at the gate of the sync. FET 5 is monitored to prevent the control FET 2 switching on until the sync FET 5 is switched off. WO98/49607 describes a circuit of this type, as does U.S. Pat. No. 5,479,089.

The dead time, when neither the control FET 2 nor the sync FET 5 is conducting, depends on the transistor threshold voltage and the capacitance of the sync FET 5, which vary widely due to the manufacturing spread of parameters of the chosen FET, as well as according to the individual choice of FET. The dead time is also dependent on the propagation delay through the monitoring circuit and the delay time of FET driver circuits. The resulting dead time may therefore be larger than the dead time required to simply prevent cross-conduction.

During the dead time, the inductor current flows through the body diode 16 of the sync FET 5. This causes body diode losses to occur. At the end of the dead time period, particularly when the opposite switch is activated, large diode reverse recovery losses, switching losses and electromagnetic induction (EMI) occur. Minimising the dead time is therefore beneficial in reducing body diode losses. If the dead time is made small enough such that the body diode does not conduct, power efficiency is improved through a reduction in switching losses, reverse recovery losses and EMI.

WO 02/063752 describes a method of minimising the dead time of a dc-dc converter by monitoring a voltage at the switch node and comparing this with a predetermined voltage.

When either the control FET or sync FET switches off, both FETs will then be off for the duration of the dead time. The inductor continues to draw current through the body diode of the sync FET and the voltage across the body diode reaches about 0.8V.

However, although such a circuit reliably avoids cross-conduction, there remains an appreciable dead time, when neither FET is switched on, of at least the delay time of the driver plus the turn-on time of the chosen FET. This dead time is about 30 ns using current technology.

An alternative approach is described in U.S. Pat. No. 6,396,250. In this approach, controllable delays are provided on the inputs to the gates of the transistors, controlled by a feedback loop signal taken from the switch node. Although this approach delivers benefits over WO 02/063752, it continues to have certain drawbacks. One of these is that it assumes the current in the coil to be always in the direction of the load at the moment the control FET is switched off. While this may be true under steady state conditions, it may not be true under transient conditions.

The principles of the analogue implementation of U.S. Pat. No. 6,396,250 are shown in FIG. 2. Feedback is taken from the switch node 3 to determine a delay to be added to the control FET control signal on line 14. This is achieved by sampling the voltage between the switch node 3 and the ground terminal 6 using sampling circuitry 20. This comprises first and second switches 21, 22, which apply the switch node voltage, across respective sampling capacitors 23, 24, to an error amplifier 25. A voltage source 26 is used to ensure that the dead time is not minimised to the extent that cross-conduction occurs. The output of the error amplifier 25 is fed into a voltage controlled delay (VCD) circuit 27, which introduces a variable delay to the PWM control signal 14. The resulting signal 28 is used to drive the control FET 2, and causes a delay before it switches on, or dead time. A similar arrangement (not shown) of sampling and VCD circuits is used to drive the sync FET 5.

During and after the dead time period, there is a large variance between the voltage at the source 29 of the sync FET 5 and the ground rail 6. This is caused by a self-inductance 30 (shown in dotted outline) of about 1 nH between the source 29 of the sync FET 5 and the ground rail 6. At the start of the dead time period, when the sync FET 5 is switched off, current flows through the sync FET body diode 16. At the end of the dead time period, when the control FET 2 is switched on, the current flowing through the body diode 16 starts to decrease. This changing current causes a potential difference across the self-inductance 30, and the voltage difference observed between the switch node 3 and the ground rail 6 is accordingly not as large in magnitude as the drain-source voltage between the source 29 and the drain 31 of the sync FET 5. Due to this, circuits that measure the voltage between the switch node 3 and ground rail 6 would inaccurately detect the time at which the sync FET body diode 16 stops conducting. Reducing or even eliminating the period during which the switch node 3 to ground rail 6 voltage is a certain magnitude, as suggested in U.S. Pat. No. 6,396,250, results in a circuit in which body diode conduction occurs, and hence losses in the circuit will remain.

In some switching circuits, such as those with a small or negligible load, current may flow backwards through the inductor, i.e. from the second terminal 17 of the inductor 1 towards the first terminal 3, when both the control and sync FETs 2, 5 are switched off. The switch node voltage thus increases, and current flows through the body diode 32 of the control FET 2. This causes the voltage at the source 33 of the control FET 2 to become a forward diode voltage higher than the voltage at its drain 34. Measuring the voltage across the drain 31 and source 29 of the sync FET 5 does not give an indication of the dead time in this case. Energy loss in the control FET body diode 32 is not as significant as that in the sync FET body diode 16. However, in certain circuits, dead time minimisation is still beneficial. For instance, in switching circuits used for applications such as digital audio amplification, too much dead time may cause signal distortion. It is therefore beneficial for a switching circuit to be able to reduce dead time in circumstances in which the inductor current is reversed.

The present invention aims to address the above problems.

According to a first aspect of the invention there is provided a switching circuit having a first field effect transistor and a second field effect transistor connected in series between an input terminal and a ground terminal, wherein a source of the first transistor is connected to the drain of the second transistor and a source of the second transistor is connected to the ground terminal, the circuit comprising control means for driving said first and second transistors alternately such that there is a dead time period during which both transistors are off and means for adjusting the length of the dead time period according to a voltage difference between the drain and the source of the first or second transistor.

By adjusting the dead time period in accordance with the voltage across the drain and the source of the second transistor, as opposed to between drain and ground, the effect of the self-inductance of the source to ground connection is eliminated and a more accurate measurement of the voltage across the body diode of the second transistor is possible. This can permit the transistors to be controlled more effectively so that the dead time, and hence loss, can be minimised.

Adjusting the dead time period in accordance with the voltage across the drain and source of the first transistor, also referred to as the control FET, enables the dead time to be reduced in the case when the inductor current flows towards the switch node. This is because a forward diode voltage difference occurs across the body diode of the control FET and is measurable across the drain and source of the control FET, rather than across the drain and source of the sync FET.

The first and/or second transistors may be constructed on an integrated circuit die, each of said transistors having respective source and drain regions on the die. The switching circuit may further comprise sensing means for sensing the voltage difference between the drain and source of the first or second transistors, wherein the sensing means has a first connection which is directly connected to the source region of the first or second transistor.

By providing a source connection on the die, the inductance between the source region and the ground terminal can be bypassed.

The sensing means can also have a second connection which is directly connected to the drain region of the first or second transistor.

By making the source and drain connections across the die, the connections can comprise Kelvin connections, in which the signal feedback lines are separated from the current path, so eliminating errors associated with the resistance and inductance of the signal lines.

According to the invention, there is also provided a method of operating a switching circuit having a first field effect transistor and a second field effect transistor connected in series between an input terminal and a ground terminal, wherein a source of the first transistor is connected to the drain of the second transistor and a source of the second transistor is connected to the ground terminal, the method comprising driving the first and second transistors alternately such that there is a dead time period during which both transistors are off; and adjusting the length of the dead time period according to a voltage difference between the drain and the source of the first or second transistor.

A further drawback to the approach of U.S. Pat. No. 6,396,250 is that the sampling circuitry in the analogue circuit arrangement has limitations. Referring again to FIG. 2, this circuitry relies on accurately driving the first and second switches 21, 22. The first switch 21 enables the sampling circuitry 20 to sample the switch node 3 voltage during the conduction of the sync FET 5, while the second switch 22 enables the sampling circuitry 20 to sample the switch node 3 during the dead time period. The sampled signals are then compared at the error amplifier 25, to provide a voltage to the voltage controlled delay circuit 27. In practice, errors in the driving of the switches 21, 22 and sampling circuits would further impair the dead time minimisation.

The digital approach described in U.S. Pat. No. 6,396,250 also has certain drawbacks in the design of its sampling circuitry. In the digital approach, the dead time delay is incremented or decremented according to whether or not the voltage at the switch node reaches a certain threshold voltage. Accordingly, the dead time is not directly reduced in proportion to either the magnitude of the body diode voltage or the length of time for which this voltage occurs. Both of these parameters influence body-diode conduction loss. In cases where the value of these parameters is high, reducing the dead time more quickly therefore minimises loss in the circuit.

Furthermore, the size of the decrement of dead time loss will have a bearing on the amount of minimisation which is achievable.

The present invention further aims to address the above-described problems.

According to a second aspect of the present invention, there is provided a switching circuit having a first field effect transistor and a second field effect transistor connected in series between an input terminal and a ground terminal, wherein a source of the first transistor is connected to the drain of the second transistor and a source of the second transistor is connected to the ground terminal, the circuit comprising control means for driving said first and second transistors alternately such that there is a dead time period during which both transistors are off, and means for adjusting the length of the dead time period according to a voltage difference between the drain of the second transistor and the ground terminal, wherein the adjusting means adjusts the length of the dead time period according to the length of time for which the voltage difference exceeds a threshold value.

The adjusting means may adjust the length of the dead time period according to the magnitude by which the voltage difference exceeds the threshold voltage.

The adjusting means may also adjust the length of the dead time period such that the length of the dead time period is exponentially dependent on the magnitude by which the voltage difference exceeds the threshold voltage, and/or linearly dependent on the length of time for which the voltage difference exceeds the threshold value.

For a better understanding of the invention, embodiments thereof will now be described, purely by way of example, with reference to the accompanying drawings, in which.

Figure 1:
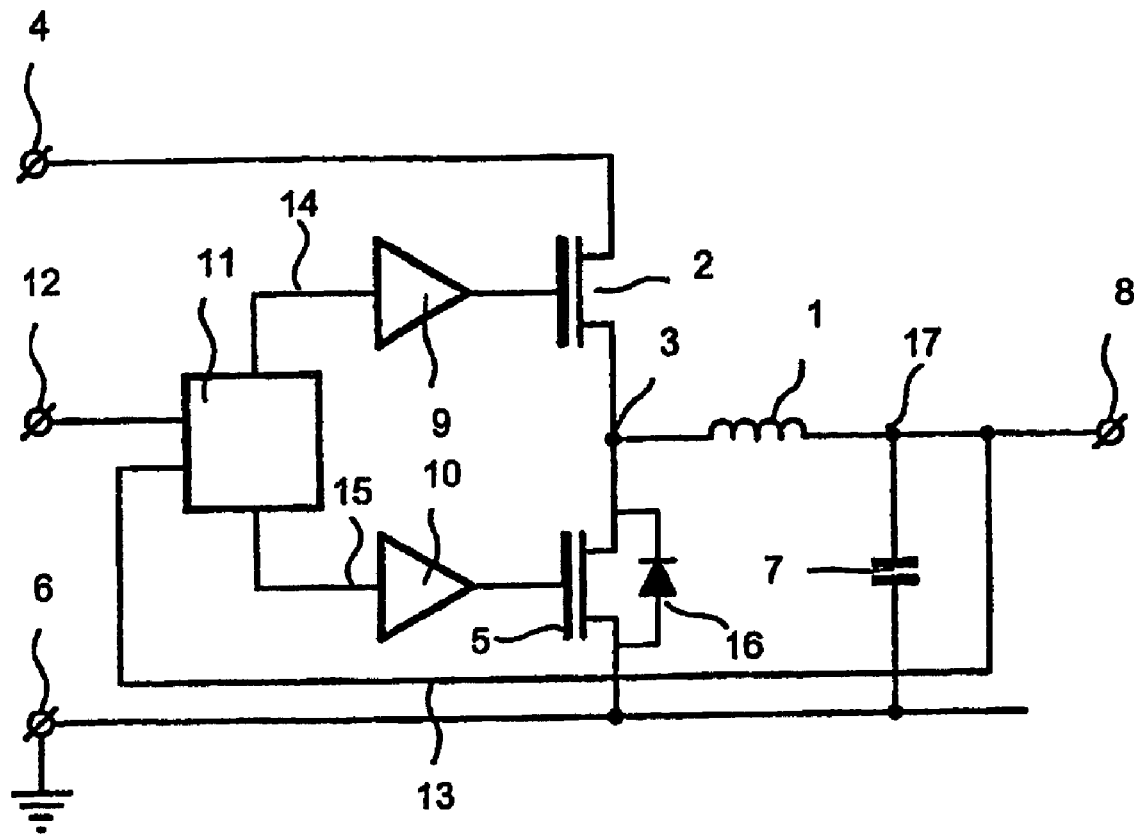
FIG. 1 illustrates a prior art synchronous dc-dc converter.
Figure 2:
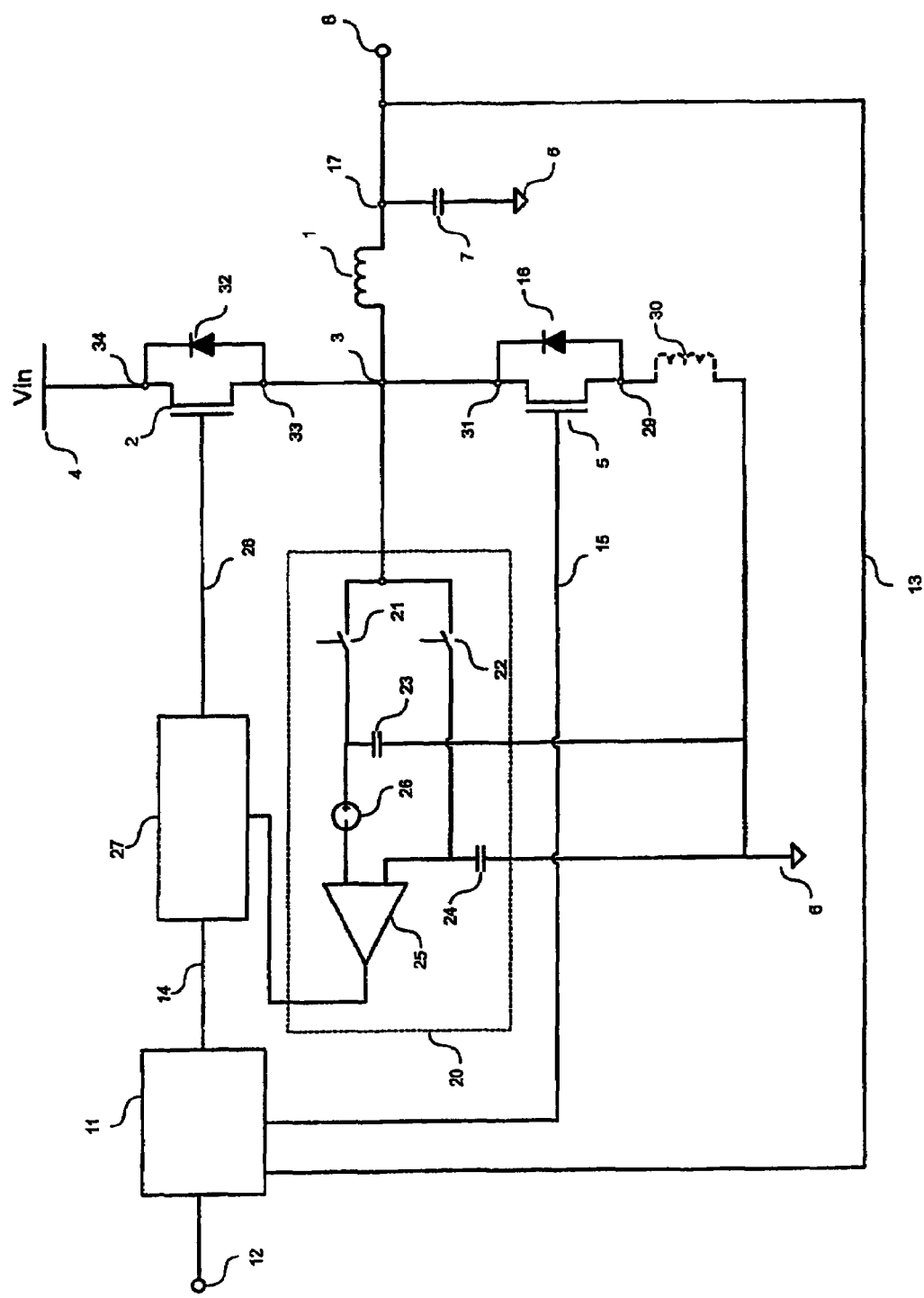
FIG. 2 illustrates a prior art synchronous dc-dc converter with added dead time according to the switch-node voltage with respect to ground.
Figure 3:
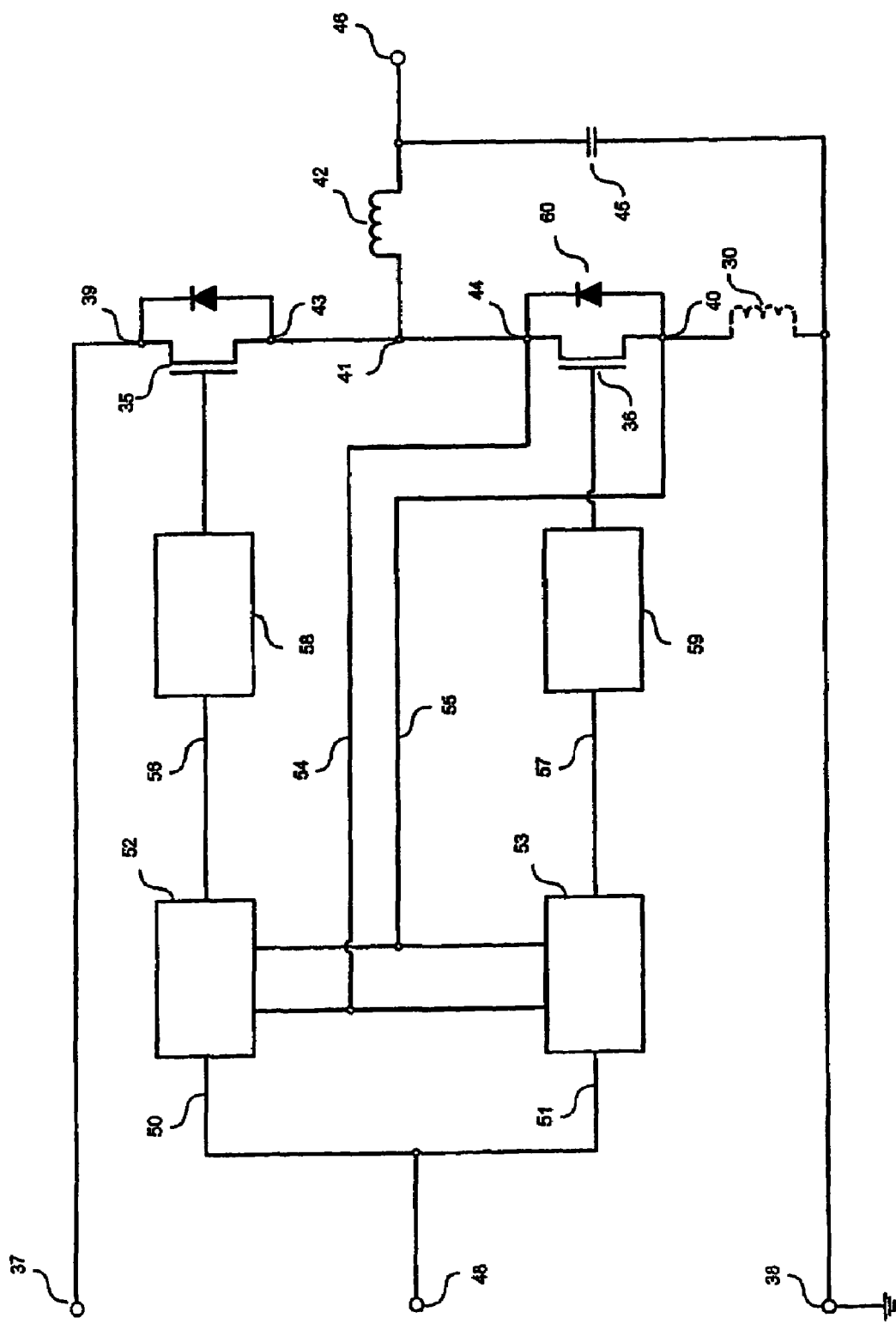
FIG. 3 is a simplified schematic of a synchronous dc-dc converter according to the invention.
Figure 4:
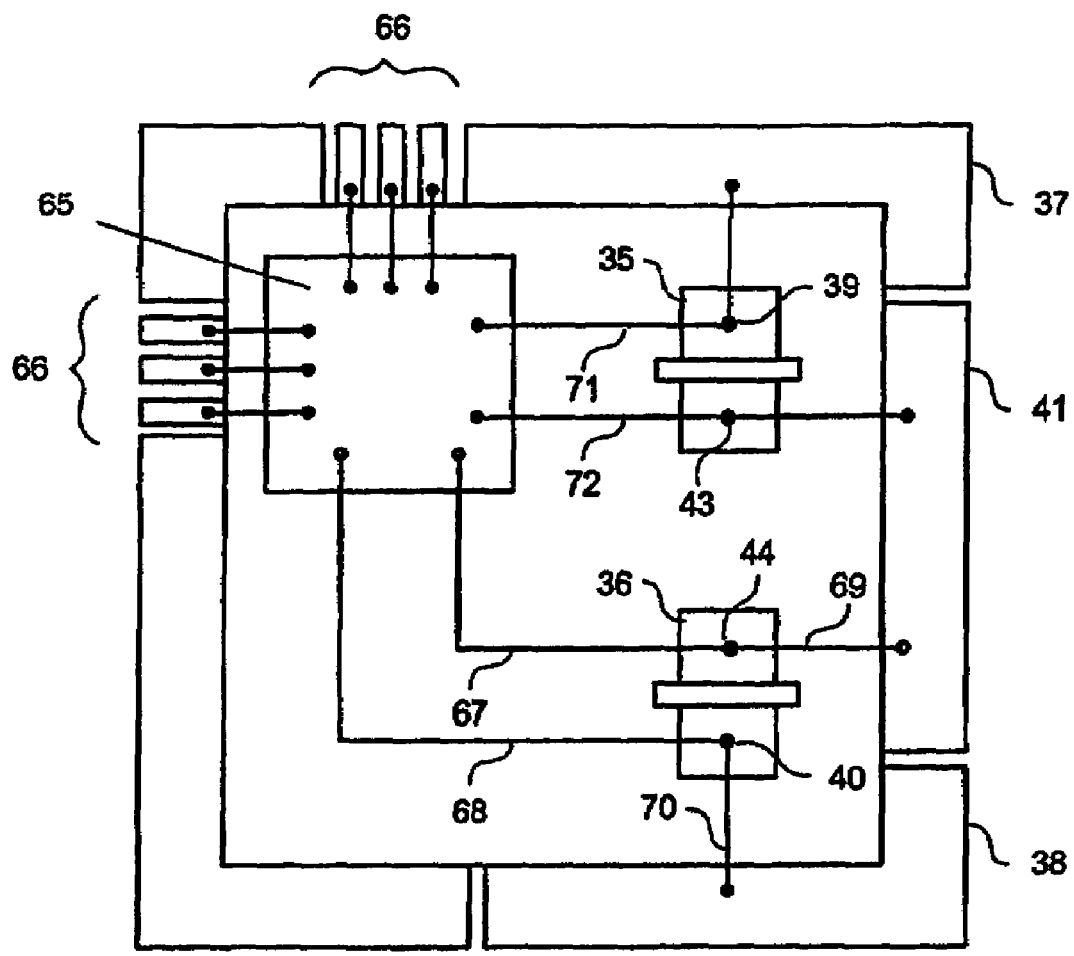
Figure 5:
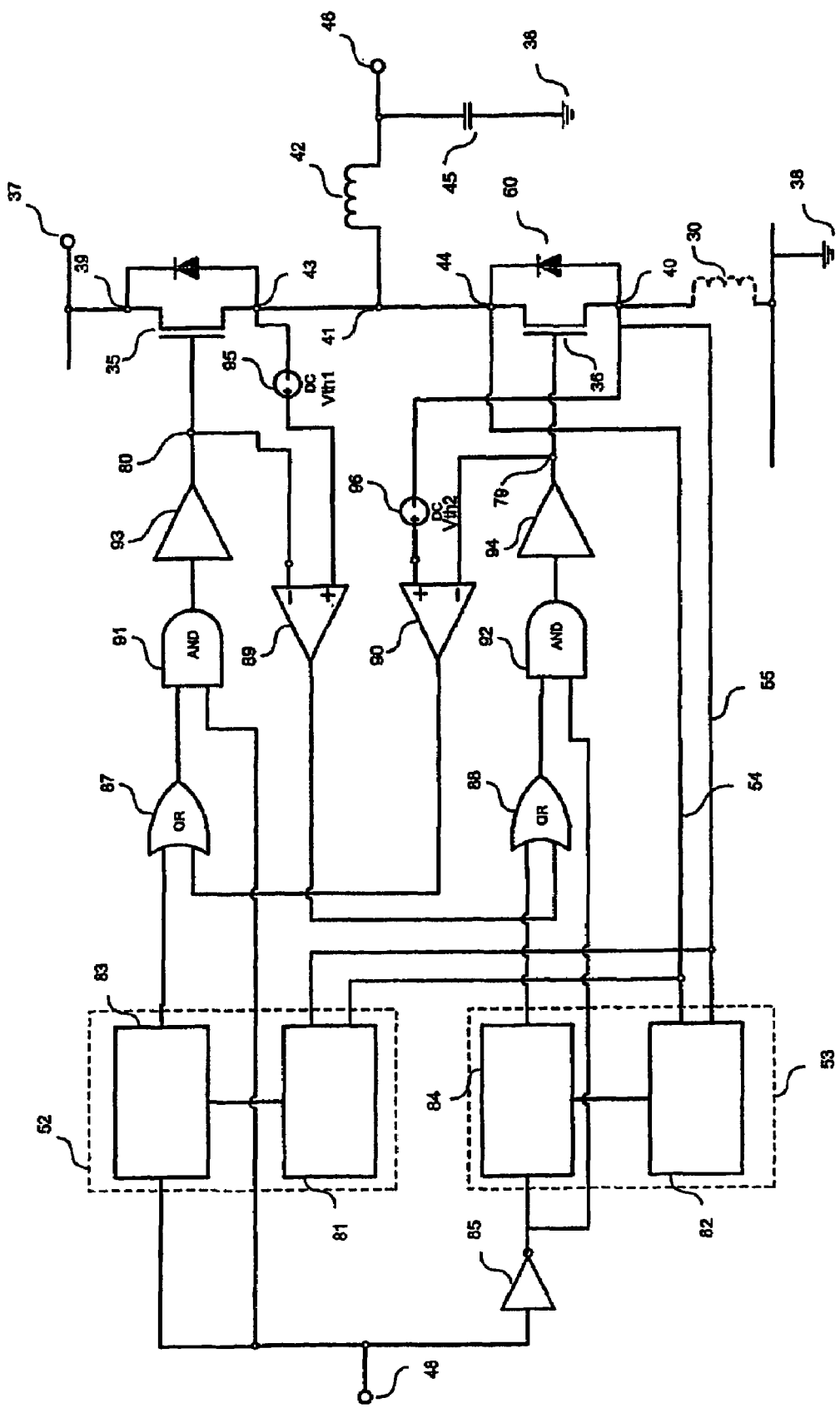
Figure 6:
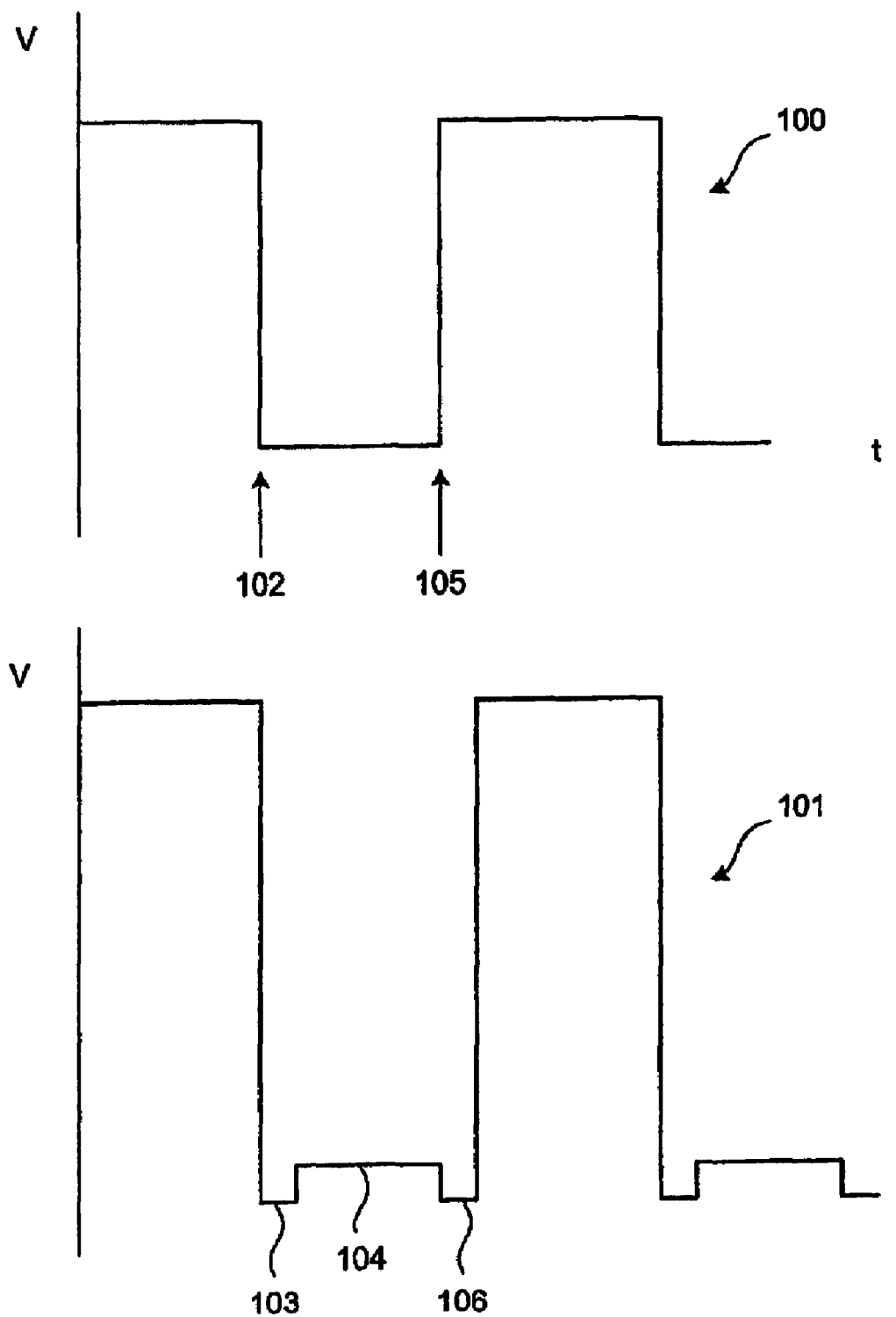
Figure 7:
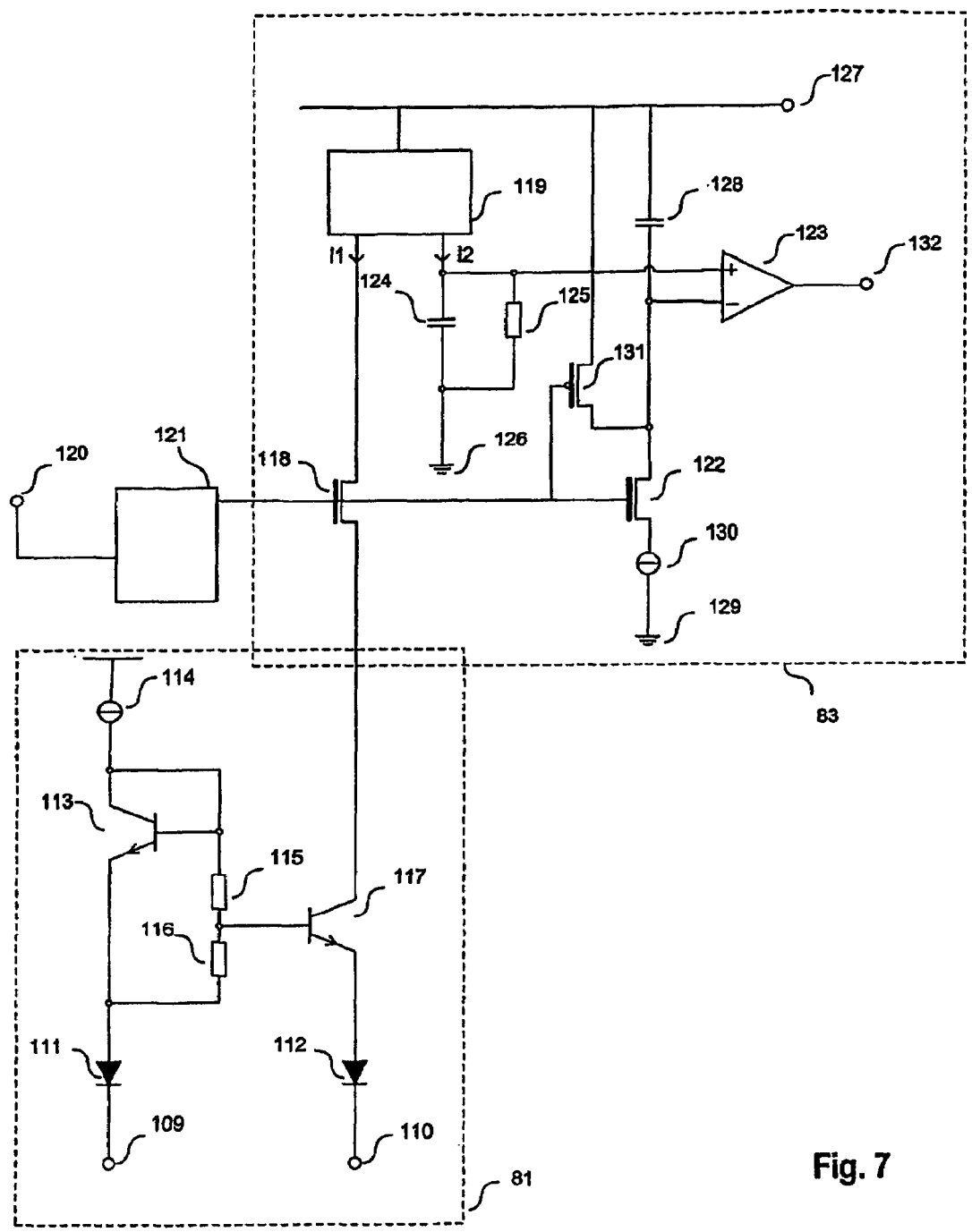
Figure 8A:
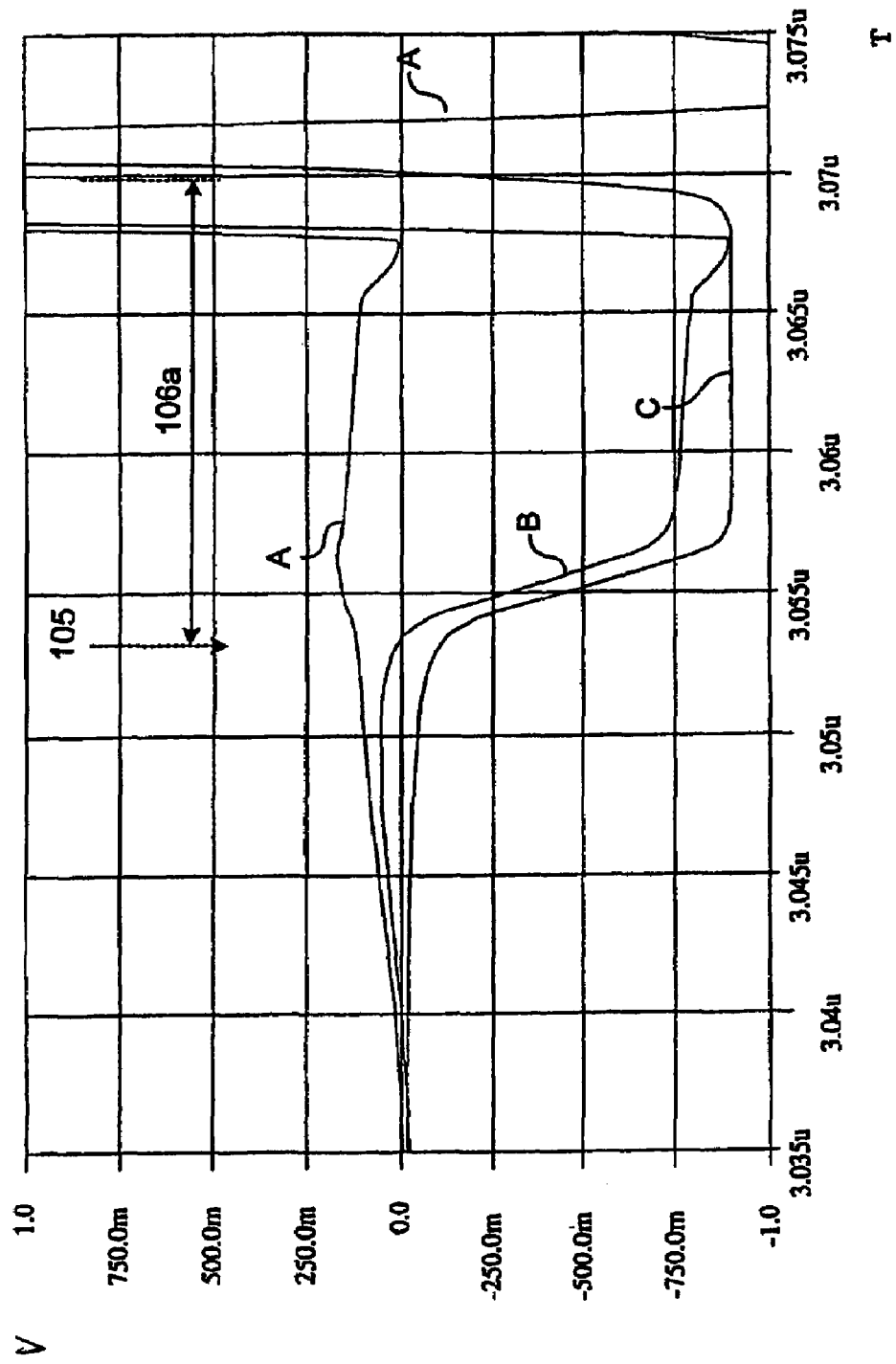
Figure 8B:
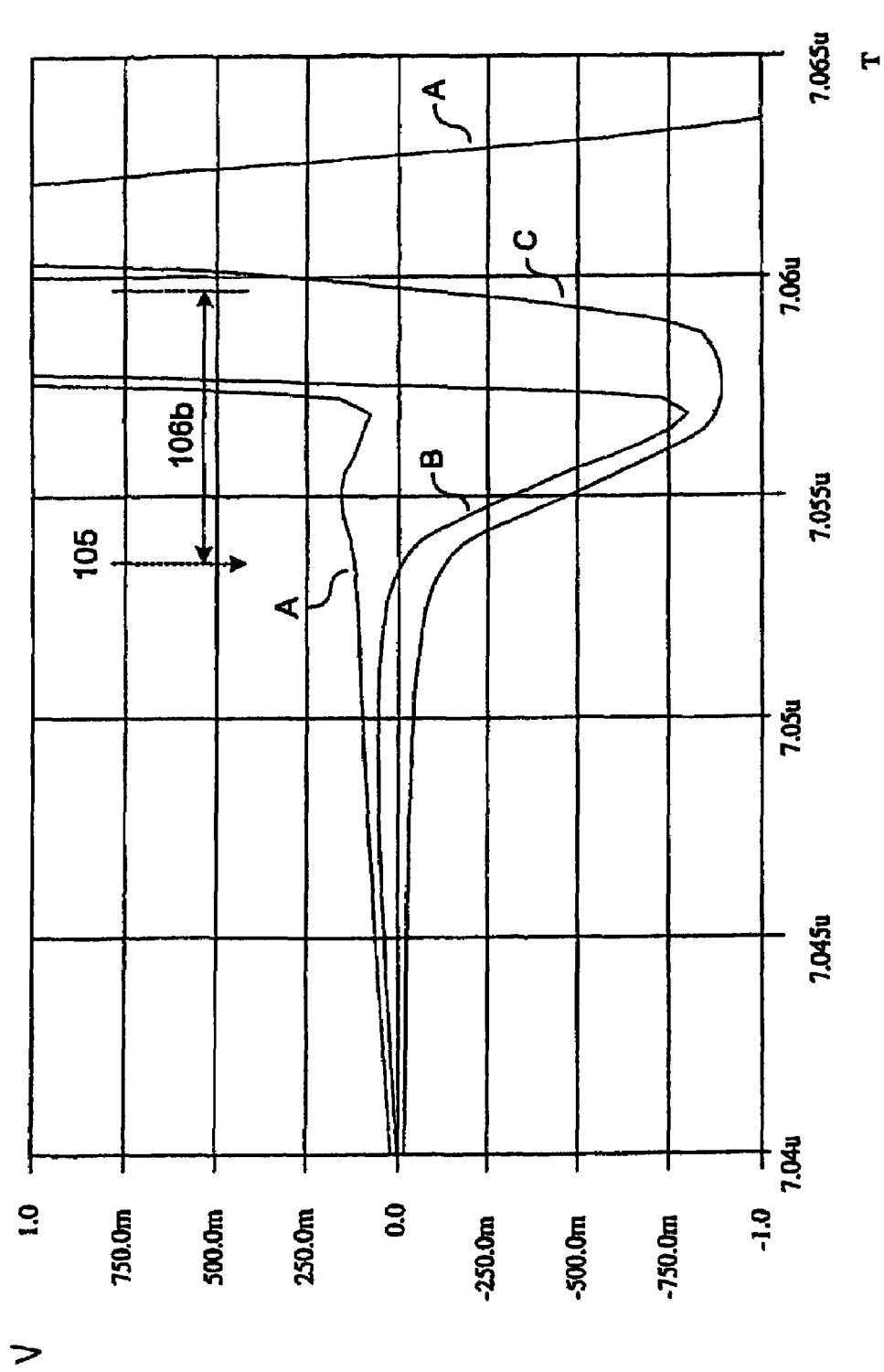
Figure 8C:
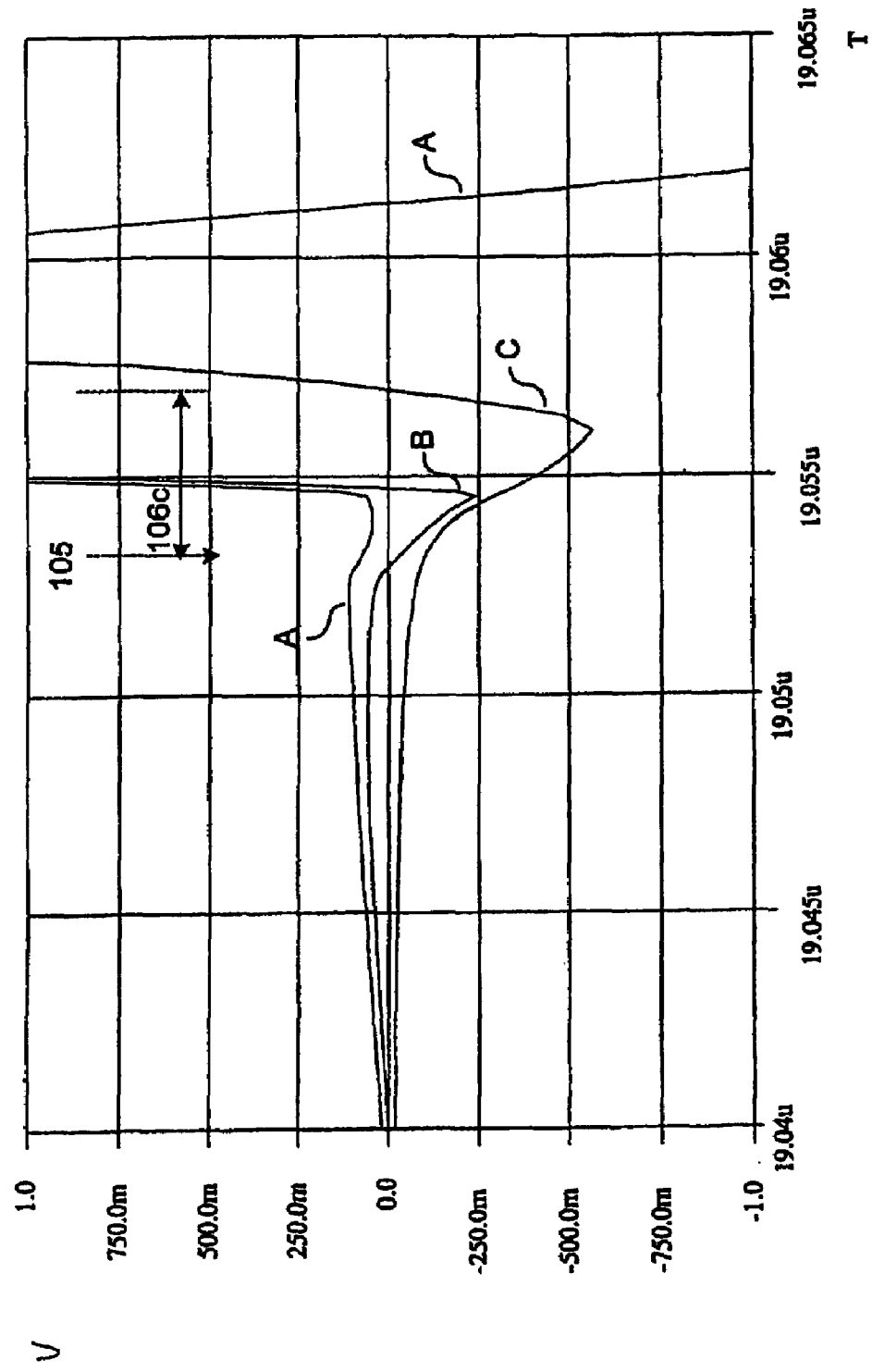

FIG. 4 schematically illustrates an integrated circuit implementation of a dc-dc converter according to the invention;

FIG. 5 schematically illustrates a further example of a synchronous dc-dc converter according to invention;

FIG. 6 is a graph showing representations of the PWM control signal and switch node voltage signal in the synchronous dc-dc converters shown in FIGS. 3 and 5;

FIG. 7 schematically illustrates the sensing and adaptive dead time reduction circuits of the converter of FIG. 5; and FIGS. 8a, 8b and 8c are graphs showing voltage signals at monitored points in a synchronous dc-dc converter according to the invention.

Referring to FIG. 3, as in conventional synchronous dc-dc converter circuits, a control FET 35 and sync FET 36 are arranged in series between an input terminal 37 and a ground terminal 38. In this example these are field effect transistors, however, other types of switching device can be used. The drain 39 of the control FET 35 is connected to the input terminal 37, and the source 40 of the sync FET 36 is connected to the ground terminal 38. A first terminal 41 of an inductor 42, the terminal generally referred to as the switch node, is connected to the source 43 of the control FET 35 and the drain 44 of the sync FET 36. Although an inductor 42 is used in this example, a transformer with two or more isolated coils may also be used. The signal at the switch node 41 feeds through the inductor 42 and across a capacitor 45 to an output terminal 46.

An output from a pulse width modulation (PWM) control circuit (not shown) is applied to a control input terminal 48. The PWM control circuit alters the duty cycle of a PWM signal according to feedback from the output terminal 46 of the converter. The PWM control circuit is not shown in the drawings since suitable PWM generation schemes are well known to the skilled person. In other embodiments of the invention alternative control signals may be used, such as pulse frequency modulation (PFM). The control signal 48 is split to form control and a sync control signals 50, 51 which are supplied to sensing and adaptive dead time reduction (ADR) circuits 52, 53. The sensing and ADR circuits 52, 53 each take feedback from the drain 44 and source 40 of the sync FET 36 via feedback lines 54 and 55, and use this to alter delay times D and E, which are introduced to the control and sync FET control signals 50, 51 respectively to produce signals with minimised dead time delay on first and second control lines 56, 57. These signals 56, 57 are applied at the gates of the control and sync FETs 35, 36 via appropriate driver circuitry 58, 59, to maintain a desired voltage at the output 46 by switching the FETs 35, 36 off and on alternately.

Taking feedback directly from the drain 44 and source 40 of the sync FET 36, enables the sensing and ADR circuits 52, 53 to accurately detect the voltage across the body-diode 60 of the sync FET 36, and to control the FETs 35, 36, so that the dead time, and hence loss, is minimised.

Although two sensing and ADR circuits 52, 53 are illustrated, one circuit could be arranged to supply the control signals for both the control and sync FETs 35, 36. Having individual circuits for each enables the delay time before the sync FET gate goes high to be different to the delay time before the control FET gate goes high, which allows more flexibility in dead time minimisation.

The dc-dc converter of FIG. 3, in one example, is implemented in an integrated circuit, as shown in FIG. 4. This illustrates how the control FET 35 and sync FET 36, as well as the driver, sensing and ADR circuitry (shown as 65) may be arranged in an integrated circuit. The control circuit input/output pins 66 are provided for input and output connections relating to the driver, sensing and ADR circuitry 65. Input and output pins 37, 41 and 38, in this example, are the input voltage terminal 37, switch node 41 and ground terminal 38 respectively.

Referring to FIG. 4, the feedback lines 67, 68 are connected directly to the sync FET drain 44 and source 40 regions of the integrated circuit die, and hence bypass the inductance between the source 40 and the ground terminal 38. Furthermore, the current path signal lines 69, 70 are completely separate from the feedback lines 67, 68, so making the connections to the source 40 and drain 44 regions Kelvin connections. This has the effect of eliminating the error caused when the feedback connections 67, 68 are taken across even a small portion of the signal lines 69, 70, which have a resistance and an inductance, and therefore influence the voltage measured, particularly whilst the sync FET 36 is conducting.

Similar Kelvin connection lines 71, 72 may be connected to the control FET drain 39 and source 43 regions of the integrated circuit die. These connections are necessary for the case in which the inductor current of the converter flows towards the switch node 41, thus requiring the voltage across the source 43 and drain 39 of the control FET 35 to be monitored.

Alternative implementations of the invention are possible. For example, the invention may be implemented in a multi-chip module (MCM), with or without the use of Kelvin connections. Also, discrete FET packages with small series self-inductances, such as DirectFET as manufactured by International Rectifier, or LFPAK manufactured by Philips Semiconductors may be used as the control and sync FETs. However, even the small inductances of these packages would cause error to the feedback measurement in circuits that exhibit large current changes over small time intervals.

FET packages having multiple source connections may also be used, whereby one of these connections would be reserved for the sync and control FET source feedback connections. Examples of such FET packages are the power SO8 and LFPAK packages manufactured by Philips Semiconductors.

The control FET may be implemented using a PMOS transistor, which can be an advantage in integrated circuit implementations.

FIG. 5 schematically illustrates a further example of a synchronous dc-dc converter according to the invention. In this example, signals are fed back from five monitoring points in the circuit, the gate 79, drain 44 and source 40 of the sync FET 36, and the gate 80 and source 43 of the control FET 35.

The signals at the drain 44 and source 40 of the sync FET 36 are fed back via lines 54, 55 to control and sync sensing circuits 81, 82, one for each of the control FET 35 and sync FET 36 driving circuitry. The control and sync sensing circuits 81, 82 in this example determine when the drain-source voltage of the sync FET 36 reaches a threshold value, and then output a signal exponentially dependent on the drain-source voltage above this threshold. The outputs from the control and sync sensing circuits 81, 82 are applied to control and sync adaptive dead time reduction (ADR) circuits 83 and 84 respectively.

The control ADR circuit 83 also receives a PWM signal, and the sync ADR circuit 84 receives an inverse PWM signal (inverted by inverter 85), both of which originate from a control circuit whose output is connected to a PWM control input terminal 48. The control circuit alters the duty cycle of the PWM signal according to feedback from the output terminal 46 of the converter. The generator is not shown in the drawings since suitable generation schemes are well known to the skilled person. In other embodiments of the invention alternative control signals may be used, such as pulse frequency modulation (PFM).

The control and sync ADRs 83, 84 introduce delays D, E, which are dependent on the input from the sensing circuits 81, 82, to the PWM signal. The resulting signals are then applied to drive the control and sync FETs 35, 36. This causes a delay to the turning on of each of the control and sync FETs 35, 36, thus introducing a dead time when both the control FET 35 and sync FET 36 are off. Having individual sensing and ADR circuits 81 to 84 for the control FET 35 and sync FET 36 as illustrated, enables them to have independent dead time delays, although one sensing and one ADR circuit could be configured to provide a delay to the turning on of both FETs.

Each of the driving signals from the ADR circuits passes through a first and a second logic OR gates 87, 88 before being applied to the control and sync FETs 35, 36. The first and second OR gates 87, 88 are incorporated so that neither the control nor the sync FET 35, 36 turns on until the driving signal at the gate of the other has fallen below a threshold voltage Vth1, Vth2, i.e. the FET has turned off, or the output from the respective ADR circuit 83, 84 has gone high. A control comparator 89 determines whether the gate-source voltage of the control FET 35 has fallen below a certain threshold voltage Vth1 supplied by voltage source 95. The control comparator 89 compares the voltage at the gate 80 of the control FET 35, applied at its first input, to the sum of the source voltage of the control FET 35 and the threshold voltage Vth1, applied at its second input. The output from this comparator 89 is then fed into a first input of second OR gate 88, and the output from the sync ADR circuit 84 is fed into its second input. Sync comparator 90 determines whether the gate-source voltage of the sync FET 36 has fallen below a threshold voltage Vth2 supplied by voltage source 96. The sync comparator 90 compares the voltage at the gate 79 of the sync FET 36, applied at its first input, to the sum of the source voltage of the sync FET 36 and the threshold voltage Vth2, applied at its second input. The output from the sync comparator 90 is then fed into a first input of the first OR gate 87, and the output from the control ADR circuit 83 is fed into the second input.

Additionally, control and sync logic AND gates 91, 92 are incorporated in series between the output of the control and sync OR gates 87, 88 and the control and sync FETs 35, 36 respectively. The control AND gate 91 has one input taken from the output of the control OR gate 87 and the other from PWM signal. This is incorporated so that the control FET 35 is off when the PWM signal is low. The sync AND gate 92 has one input taken from the output of OR gate 88 and the other from the inverse of PWM signal. This is incorporated so that the sync FET 36 is off when the inverse of the PWM control signal is low.

In alternative embodiments of the invention other combinations of logic circuitry may be used. For instance, the OR gates 87, 88 with their respective comparators 89, 90, and/or the AND gates 91, 92 may be omitted entirely, or omitted from one of the sync FET 36 or control FET 35 logic circuitry.

Control and sync buffer amplifiers 93, 94 are also added in series to receive the control signals with added dead time, and to output gate driving signals to drive the control and sync FETs 35, 36.

In further embodiments, alternative control and sync sensing circuits are provided which are similar to control and sync sensing circuits 81, 82, but which take feedback signals from the drain 39 and source 43 of the control FET 35, in the case in which current flows from the second terminal of the inductor towards the first during the dead time period. These alternative sensing circuits could be provided either in addition to or in place of control and sync sensing circuits 81 and 82. In either case the control and sync ADR circuits 83, 84 would be configured to receive signals from the alternative control and sync sensing circuits.

The operation of the embodiment of FIG. 5 will now be described in more detail with reference to FIG. 6 of the accompanying drawings.

The sequence of PWM switching pulses 100 input at the PWM input terminal 48 is shown in the upper part of FIG. 6. The voltage 101 on the sync FET drain 44 is illustrated in the lower part of FIG. 6.

When the PWM signal 100 falls at a first time 102, the control FET 35 is switched off due to the low value at the PWM input to the control AND gate 91. This causes the voltage at the sync FET drain 44 to start to fall, as current continues to be drawn by the inductor 42, but rather than passing through the control FET 35 or the sync FET 36 which are both off, the current passes through the body diode 60 of the sync FET 36. This process ends with the voltage on the sync FET drain 44 being determined by the voltage drop across the body diode 60 of the sync FET 36, i.e. around −0.8V (during second time period 103).

When the voltage across the sync FET drain 44 and source 40 falls below a predetermined reference value, for example −0.4V, the sync sensing circuit 82 is triggered. The output from this circuit is a current which is supplied to the sync ADR circuit 84 and which determines a delay, 'E'. This current, in this embodiment, is exponentially dependent (up to a certain maximum value) on the amount of the sensed voltage difference across the drain 44 and source 40 of the sync FET 36 which is greater than the predetermined reference voltage, and active during the time that the sensed voltage difference is greater than the reference voltage. Accordingly, the delay 'E', and therefore the dead time, is exponentially dependent on the magnitude by which the voltage difference exceeds the threshold voltage and linearly dependent on the length of time for which the voltage difference exceeds the threshold value.

When the control signal 100 falls at the first time 102, the sync ADR 84 thus introduces delay 'E' (second time period 103) to the control signal, so that time E will lapse, unless the output of comparator 89 has gone high, before the sync FET 36 is driven high. In normal circuit operation, the detection of the sync FET drain-source voltage (body-diode voltage) and the application of the detected signal to the ADR circuitry 83, 84 is likely to take longer than the dead time delay required.

For this reason, the delays D and E will generally be dependent only upon previously detected body-diode voltages.

When the control FET gate 80 falls below Vth1, the output of the control comparator 89 will immediately go high. If the delay E introduced by the sync ADR 84 is longer than the propagation delay through the control comparator 89 from the time when the control FET gate 80 fell below threshold voltage Vth1, the output of OR gate 88 will already have gone high before delay E has lapsed and thus the sync ADR 84 output has no effect. This may occur during the first few initialising cycles of the converter circuit. The output from the sync OR gate 88 is fed into the sync logic AND gate 92, which only allows the sync FET 36 to be driven high if the sync OR gate 88 output is high, and if the inverted PWM signal is high. As the PWM signal is low, this is the case, and the sync FET 36 is turned on.

With the sync FET 36 switched on, and entering the linear region, the voltage on the sync FET drain 44 rises during a third time period 104 to approximately −0.1V.

When the control signal 100 rises at a fourth time 105, first the sync FET 36 is switched off due to the low signal at the inverse PWM input of the sync AND gate 92. Again, current is transferred to the body diode 60 of the sync FET 36, which makes the drain-source voltage of the sync FET 36 more negative, as shown at a fifth time period 106. When the voltage falls below a predetermined voltage, for example −0.4V, the control sensing circuit 81 is triggered. The output from this circuit is a current which is supplied to the sync ADR circuit 83 and which determines a delay, 'D'. This current, in this embodiment, is exponentially dependent (up to a certain maximum value) on the amount of the sensed voltage difference across the drain 44 and source 40 of the sync FET 36 which is greater than the predetermined reference voltage, and active during the time that the sensed voltage difference is greater than the reference voltage. Accordingly, the delay 'D', and therefore the dead time, is exponentially dependent on the magnitude by which the voltage difference exceeds the threshold voltage and linearly dependent on the length of time for which the voltage difference exceeds the threshold value.

When the control signal 100 rises at the fourth time 15, the control ADR 83 thus introduces delay 'D' (fifth time period 106) to the control signal, so that time D will lapse, unless the output of comparator 90 has gone high, before the control FET 35 is driven high.

When the sync FET gate 79 falls below Vth2, the output of the sync comparator 90 will immediately go high. If the delay D introduced by ADR 83 is longer than the propagation delay through the sync comparator 90 from the time when the sync FET gate 79 fell below threshold voltage Vth2, the output of the control OR gate 87 will already have gone high before delay D has lapsed and thus the control ADR 83 output has no effect. This may occur during the first few initialising cycles of the converter circuit. The output from the control OR gate 87 is fed into the control logic AND gate 91, which only allows the control FET 35 to be driven high if the control OR gate 87 output is high and the PWM signal is high. As the PWM signal is high the control FET 35 is turned on.

FIG. 7 illustrates the control sensing circuit 81 and control ADR circuit 83 for driving the control FET 35. Referring firstly to the sensing circuit 81, two signals are inputted at first and second input terminals 109 and 110. The source 40 and drain 44 of the sync FET 36 are connected to these terminals 109 and 110 respectively (not shown). These terminals are connected to the cathodes of first and second diodes 111, 112. The anode of the first diode 111 is connected to the emitter terminal of a first bipolar junction transistor (BJT) 113, the collector and base terminals of which are both connected to a first current source 114. First and second resistors 115, 116 are connected in series between the base of the first BJT 113 and the anode of the first diode 111. The base terminal of a second BJT 117 is connected to a node connected in series between the first and second resistors 115, 116, and the emitter terminal is connected to the anode of the second diode 112. The output of sensing circuit 81 is taken at the collector of the second BJT 117, via a first FET 118 and into a current mirror circuit 119 in the control ADR circuit 83.

During the dead time period, the voltage at the drain 44 of the sync FET 36 will, when the dead time is not minimised, become approximately 0.8V more negative than the voltage at the source 40. The first and second resistors 115, 116 are arranged in this example such that when the sync FET 36 drain-source voltage reaches half of its peak voltage (−0.4V), this will increase the potential across the base-emitter junction of the second BJT 117 enough to allow conduction in the second BJT 117 current path. This current will increase exponentially (up to a certain maximum) as the sync FET drain-source voltage increases above half its peak voltage.

The PWM signal 100 is inputted to the control ADR circuit 83 at a third input terminal 120, passes through a one-shot circuit 121, and is used to control the first FET 118 and a second FET 122. When the PWM signal 100 becomes high, i.e. when the control FET 35 is to be turned on, the first FET 118 turns on and a current I1 flows through a first path of the current mirror circuit 119. In one circuit configuration, this current will increase by a factor of ten for every 120 mV that the body diode voltage is greater than at half its peak value. The second path of the current mirror 119 also then conducts a current I2. This path is connected to the positive terminal of a comparator 123, as well as to a first capacitor 124 and third resistor 125 which are in parallel between the current mirror 119 and a ground terminal 126. The current I2 in the second current mirror path charges the first capacitor 124 and the voltage at the positive input of the comparator 123 thus increases.

The negative input to the comparator 123 is connected to a supply voltage terminal 127, via a second capacitor 128, and to a ground terminal 129 via a series combination of the current path of the second FET 122 and a second current source 130. The negative input to the comparator 123 and the drain of the second FET 122 are also connected to the source of a third FET 131, whose drain is connected to the supply voltage terminal 127 and whose gate is connected to the one-shot 121 output.

The one-shot circuitry 121 is arranged such that its output rises to logic high when a rising PWM edge is detected, and falls to a logic low signal when a falling PWM edge is detected, or after a certain delay. Whilst the one-shot output is high, the second FET 122 conducts, and the third FET 131 is off. The voltage at the negative input of the comparator 123 thus falls from the supply voltage to ground over a period of time dependent on the value of the second capacitor 128 and the magnitude of the current produced by the current source 130.

At the time when the falling voltage at the negative input of the comparator thus reaches a level equal to the voltage at the positive comparator 123 input, the output of the comparator 123 goes high, and a driving signal is outputted, via the output terminal 132, to turn on the control FET 35.

When the PWM control signal goes low, or after a certain delay, first and second FETs 118 and 122 are turned off and third FET 131 is turned on. Accordingly, the first capacitor 124 starts to discharge through the third resistor 125 causing the voltage at the positive input terminal of the comparator 123 to decrease very slightly. Also, the negative input terminal of the comparator 123 is raised to the supply voltage by the third FET 131, and the second capacitor 128 therefore discharges. The output of the comparator 123 goes low, until the next positive PWM signal 100 triggers the ADR circuitry 83. The voltage across the second capacitor 124, the value of the third resistor 125, and the rate of the falling voltage at the negative comparator 123 input will determine the delay to be added to the control FET control signal the next time the PWM signal 100 goes high.

The sensing and ADR circuits 82, 84 for driving the sync FET 36 are identical to those for driving the control FET 35, but are configured to be activated by an inverse PWM control signal. One way this could be achieved is by using the inverter 85 shown in FIG. 5, or equally by altering the one-shot circuit 121. The third resistor 125 may be replaced by a current source which is switched on for a fixed amount of time during each period of the PWM signal 100. This means that the rate of discharge of the second capacitor 124 is independent of its voltage level and that the action of the ADR circuit becomes independent to the switching frequency of the PWM signal 100.

In the case in which alternative control and sync sensing circuits are provided which take feedback from the drain and source of the control FET, rather than the sync FET, these would comprise pnp transistors rather than the npn transistors illustrated in FIG. 7. If the alternative control and sync sensing circuits are provided in addition to control and sync sensing circuits 81, 82, the output from the alternative control and sync sensing circuits would be combined with the output 12 of the current mirror 119 of control and sync ADR circuits 83, 84 respectively.

The first and second diodes 111, 112 are incorporated in the sensing circuitry 81, 82 for protection of the base-emitter junction of transistor 117 when the switch node 41 goes high. In alternative embodiments, active (MOS) switches could be used in place of the passive (bipolar) diodes 111, 112 which automatically switch off when the drain-source voltage of the sync FET 36 rises above a certain level. Also, in place of the vertical bipolar junction transistors 113, 117, lateral bipolar junction transistors could be used which can resist much higher reverse voltages, and accordingly the use of diodes 111, 112 may be unnecessary. However, lateral bipolar junction transistors usually have relatively small current amplification.

When using active (MOS) switches rather than diodes 111, 112, or when using lateral bipolar junction transistors in place of the vertical bipolar junction transistors 113, 117, and no diodes 111, 112, all of the voltage difference between drain 44 and source 40 of the sync FET 36 would be applied across the base and emitter of transistor 117 rather than divided between the diodes 111, 112 and the base-emitter junction. Accordingly, the current I1 in the first current path of the current mirror 119 would increase by a factor of 10 for every 60 mV that the voltage difference across the drain 44 and source 40 of the sync FET 36 is greater than a predetermined value, such as half of its maximum value.

Rather than using a single BJT 117, a Darlington configuration or a field effect transistor may be used, with diodes 111, 112 if necessary. The voltage across the first resistor 115 should be approximately equal to the predetermined reference voltage, which is, in the example illustrated in FIG. 7, equal to half the forward body diode voltage of the sync FET. The voltage across the first resistor 115 would preferably have the same temperature dependence as the forward body diode voltage of the sync FET.

When using field effect transistors in the place of BJT 117, the current amplification will tend to be more quadratic than exponential in relation to the voltage difference across the drain 44 and source 40 of the sync FET 36, unless used in the subthreshold or weak inversion region where the amplification is exponential for very low current densities.

FIGS. 8a to 8c illustrate voltage levels of a dc-dc converter circuit according to the invention, with a load across the output of 10A. Each of the graphs show the voltage levels during the fifth time period 106 (see FIG. 6) when the PWM signal 100 goes high at time 105, the sync FET 36 is turned off, and a delay 'D' is added by the control ADR circuitry 83 before the control FET 35 is turned on. Curve A is the voltage at the sync FET source 40 with respect to ground 38. Curve B is the voltage at the sync FET drain 44 with respect to ground 38, and Curve C is the drain-source voltage of the sync FET 36.

FIG. 8a illustrates the voltages at a time when dead time minimisation has not yet occurred. It can be seen that there is a large variance between the sync FET source 40 (curve A) and the ground 38 when the dead time minimisation occurs. This is caused by self-inductance of the source 40 to ground 38 connection, and results in the voltage at the sync FET drain 44 with respect to ground 38 (curve B) not having as large a magnitude as the sync FET drain-source voltage (curve C). This means that monitoring curve B to reduce dead time, as performed in the prior art, does not reduce body diode conduction, and therefore loss, to the same extent as monitoring curve C. It can be seen that the body diode 60 conducts for a period 106a of roughly 15 nanoseconds (illustrated by curve C).

FIG. 8b illustrates the voltages after a further 4 microseconds, when dead time minimisation is almost finished. The body diode 60 now conducts for substantially less time than at the start of the minimisation. Curve C suggests this time period 106b to be approximately half that at the start, i.e. 7.5 nanoseconds.

FIG. 8c illustrates the voltages after a further 12 microseconds. At this stage dead time minimisation has finished, and, in this embodiment, the dead time has been reduced to a dead time 106c of approximately 3.5 nanoseconds. The voltage across the body diode (curve c) falls to approximately −550 mV. Were prior art circuits which monitor the sync FET drain to ground voltage (curve B) to reduce their monitored voltage so that it is negative for only 3.5 nanoseconds, or drops to a minimum of −550 mV, the true dead time and body diode voltages (curve C) would be much greater than those possible with the current invention.

From reading the present disclosure, other variations and modifications will be apparent to persons skilled in the art. Such variations and modifications 30 may involve equivalent and other features which are already known in the design, manufacture and use of synchronous dc-dc converters and which may be used instead of or in addition to features already described herein.

Although claims have been formulated in this application to particular combinations of features, it should be understood that the scope of the disclosure of the present invention also includes any novel features or any novel combination of features disclosed herein either explicitly or implicitly or any generalisation thereof, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further applications derived therefrom.

For example, the embodiments described use the approach of the invention for controlling both transistors, but it is possible to use the approach only for controlling one transistor, and not the other.

There is no need for both the transistors to be n-channel. For example either the control FET or both the control and sync FETs could be p-channel. In this case, the control driving circuitry would need to be adjusted accordingly.

Further, although the described embodiments relate to a switching voltage converter the invention is also applicable to a switching amplifier or any other switching power circuit having synchronous switches.

The invention claimed is:

1. A switching circuit having a first field effect transistor and a second field effect transistor connected in series between an input terminal and a ground terminal, wherein a source of the first transistor is connected to the drain of the second transistor and a source of the second transistor is connected to the ground terminal, the circuit comprising: control means for driving the first and second transistors alternately such that there is a dead time period during which both transistors are off; and means for adjusting the length of the dead time period according to a voltage difference between the drain and the source of the first or second transistor.

2. A switching circuit according to claim 1, wherein the first and/or the second transistors are constructed on an integrated circuit die, each of said transistors having respective drain and source regions on said die, further comprising sensing means for sensing the voltage difference between the drain and the source of the first or second transistors, wherein this sensing means has a first connection, which is directly connected to the source region of the first or second transistor.

3. A switching circuit according to claim 2, wherein the sensing means has a second connection which is directly connected to the drain region of the first or second transistor.

4. A switching circuit according to claim 2, wherein the first and/or second connections are Kelvin connections.

5. A switching circuit according to claim 2, wherein the sensing means senses the voltage difference during the dead time period.

6. A switching circuit according to claim 1, wherein the adjusting means adjusts the length of future dead time periods according to the voltage difference during the dead time period.

7. A switching circuit according to claim 1, wherein the adjusting means adjusts the length of the dead time period according to the length of time that the voltage difference exceeds a threshold voltage.

8. A switching circuit according to claim 1, wherein the adjusting means adjusts the length of the dead time period according to the magnitude by which the voltage difference exceeds a threshold voltage.

9. A switching circuit according to claim 1, wherein the adjusting means adjusts the length of the dead time period such that the length of the dead time period is exponentially dependent on the magnitude by which the voltage difference exceeds a threshold voltage.

10. A switching circuit according to claim 1, wherein the adjusting means adjusts the length of the dead time period such that the length of the dead time period is linearly dependent on the length of time for which the voltage difference exceeds a threshold value.

11. A switching circuit according to claim 1, comprising circuitry to prevent the first transistor from turning on until the second transistor has turned off.

12. A switching circuit according to claim 1, comprising circuitry to prevent the second transistor from turning on until the first transistor has turned off.

13. A dc-dc converter circuit comprising the switching circuit of claim 1.

14. A method of operating a switching circuit having a first field effect transistor sand a second field effect transistor connected in series between an input terminal and a ground terminal, wherein a source of the first transistor (is connected to the drain of the second transistor and a source of the second transistor is connected to the ground terminal, the method comprising: driving the first and second transistors alternately such that there is a dead time period during which both transistors are off; and adjusting the length of the dead time period according to a voltage difference between the drain and the source of the first or second transistor.

15. A switching circuit having a first field effect transistor and a second field effect transistor connected in series between an input terminal and a ground terminal, wherein a source of the first transistor is connected to the drain of the second transistor and a source of the second transistor is connected to the ground terminal, the circuit comprising: control means for driving said first and second transistors alternately such that there is a dead time period during which both transistors are off; and means for adjusting the length of the dead time period according to a voltage difference between the drain and the source of the second transistor, wherein the adjusting means adjusts the length of the dead time period according to the length of time for which the voltage difference exceeds a threshold value.

16. A switching circuit according to claim 15, wherein the adjusting means adjusts the length of the dead time period according to the magnitude by which the voltage difference exceeds the threshold voltage.

17. A switching circuit according to claim 15, wherein the adjusting means adjusts the length of the dead time period such that the length of the dead time period is exponentially dependent on the magnitude by which the voltage difference exceeds the threshold voltage.

18. A switching circuit according to claim 15, wherein the adjusting means adjusts the length of the dead time period such that the length of the dead time period is linearly dependent on the length of time for which the voltage difference exceeds the threshold value.

* * * * *